(12) United States Patent  (10) Patent No.: US 12,520,651 B2
Condorelli et al.  (45) Date of Patent: Jan. 6, 2026

(54) MULTIJUNCTION PHOTOVOLTAIC CELL AND RELATED METHOD OF FABRICATION

(71) Applicant: 3SUN S.R.L., Catania (IT)

(72) Inventors: Giuseppe Condorelli, Misterbianco (IT); Grazia Litrico, Catania (IT); Salvatore Bellino, Palagonia (IT); Alfredo Di Matteo, Aci Catena (IT); Alessandro Furnari, Riposto (IT); Cosimo Gerardi, Motta S. Anastasia (IT)

(73) Assignee: 3SUN S.R.L., Catania Ct (IT)

( * ) Notice: Subject to any disclaimer, the term of this patent is extended or adjusted under 35 U.S.C. 154(b) by 18 days.

(21) Appl. No.: 18/683,939

(22) PCT Filed: Aug. 18, 2022

(86) PCT No.: PCT/IB2022/057738
§ 371 (c)(1),
(2) Date: Feb. 15, 2024

(87) PCT Pub. No.: WO2023/021453
PCT Pub. Date: Feb. 23, 2023

(65) Prior Publication Data
US 2024/0365570 A1   Oct. 31, 2024

(30) Foreign Application Priority Data
Aug. 18, 2021  (IT) .................. 102021000022034

(51) Int. Cl.
*H10K 30/57* (2023.01)
*H10K 30/81* (2023.01)
*H10K 39/15* (2023.01)

(52) U.S. Cl.
CPC ............. *H10K 30/57* (2023.02); *H10K 30/81* (2023.02); *H10K 39/15* (2023.02)

(58) Field of Classification Search
CPC ......... H10K 30/57; H10K 30/81; H10K 39/15
See application file for complete search history.

(56) References Cited

U.S. PATENT DOCUMENTS

2014/0020746 A1\* 1/2014 Lennon ................. H10F 77/955
                                                                 438/83
2016/0329446 A1  11/2016 Lim et al.
(Continued)

FOREIGN PATENT DOCUMENTS

JP       2010272651 A    12/2010

OTHER PUBLICATIONS

Yan (Silicon nitride/silicon oxide interlayers for solar cell passivating contacts based on PECVD amorphous silicon), Phys. Status Solidi RRL 9, No. 11, 617-621 (2015) (Year: 2015).\*

(Continued)

*Primary Examiner* — Devina Pillay
(74) *Attorney, Agent, or Firm* — Lucas & Mercanti, LLP

(57) ABSTRACT

In multijunction photovoltaic cells, such as for example tandem solar cells having a top sub-cell and a crystalline silicon based bottom sub-cell, efficiency of conversion of solar energy into electrical energy is limited mainly by the junction between a top sub-cell and a bottom sub-cell of the multijunction photovoltaic cell. A multijunction photovoltaic cell of this disclosure at least partially overcomes this drawback because it has an intermediate layer of silicon nitride deposited in a conformal manner with a thickness of between 1 and 10 nm so as to define a P-N tunnel junction between the top sub-cell and the bottom sub-cell. A related fabrication process is also disclosed.

2 Claims, 3 Drawing Sheets

(56) References Cited

U.S. PATENT DOCUMENTS

2018/0226529 A1    8/2018   Uzu et al.
2023/0163228 A1*   5/2023   Lee ...................... H10F 77/315
                                                                                                 136/255

OTHER PUBLICATIONS

International Search Report and Written Opinion for Corresponding International Application No. PCT/IB2022/057738, 15 pages, Nov. 7, 2022.

* cited by examiner

FIG. 3c  FIG. 3d

MULTIJUNCTION PHOTOVOLTAIC CELL AND RELATED METHOD OF FABRICATION

CROSS-REFERENCE TO RELATED APPLICATIONS

This application is a 371 of PCT/IB2022/057738, filed Aug. 18, 2022, which claims the benefit of Italian Patent Application No. 102021000022034, filed Aug. 18, 2021.

TECHNICAL FIELD

This disclosure relates in general to photovoltaic cells and more in particular to a multijunction photovoltaic cell comprising at least a top sub-cell and a crystalline silicon bottom sub-cell stacked together, as well as a related method of fabrication of such a multijunction photovoltaic cell.

BACKGROUND

Silicon photovoltaic cells may be capable of converting light with a wavelength greater than approximately 400 nm and less than approximately 1100 nm to electrical power. The conversion efficiency of a silicon photovoltaic cell for wavelengths significantly shorter than 1100 nm is increasingly poor with decreasing wavelength, because a corresponding increasing portion of the energy of each photon is dissipated as heat.

A tandem photovoltaic cell may include a top cell having a higher band gap than silicon, and, accordingly capable of more efficiently converting short-wavelength light to electrical power. If the top cell is transparent to longer wavelengths, then it may be assembled with a bottom cell, which may be a silicon photovoltaic cell, so that the bottom cell may convert the light transmitted through the top cell to electrical power.

In tandem cells, Perovskite or Gallium Arsenide cell is coupled with Silicon based cell.

The possibility to fabricate top cell by low-cost solution processing may decrease the cost of energy of photovoltaics toward the grid-parity milestone.

Among all technologies Silicon Heterojunction is the most promising technology could be used as bottom cell.

A considerable amount of R&D activity has been done in the last years to develop the heterojunction technology (HJT), characterized by an amorphous intrinsic hydrogenated silicon layer (a-Si:H) as passivation layer deposited on a crystalline silicon wafer surface (c-Si). The realization of high efficient a-Si:H/c-Si HJT is not trivial because the optimization of chemical and physical processes must take into account often the high cost of some consumable elements, like Silver paste used for metallization.

Tandem photovoltaic cells based on crystalline silicon present a practical route toward low-cost cells with efficiencies above 30%. The most common tandem configuration consists of a high-efficiency c-Si bottom cell and a thin-film top cell based on low-cost materials.

A monolithic tandem device architecture would be attractive since the two-terminal configuration simplifies the cell interconnection on module level, and reduces metallization and BOS costs. In this structure, supposing a NIP configuration, the hole transport layer of the top cell is connected to the electron-collecting n+ type and phosphorus-doped front emitter of the Si bottom cell.

HJT bifacial photovoltaic cells [1] are typically realized by employing a very thin a-Si:H layer (10÷20 nm) on the both side of a mono-crystalline Si wafer. A scheme of HJT photovoltaic cell suitable for tandem realization as bottom cell is shown in FIG. 1 and is illustrated in detail in [1].

Before the deposition of a-Si:H, the Si bulk substrate, typically with a 1-10 Ω cm resistivity and thickness of 180 µm, experienced a texturization process, consisting of several different chemical etching steps that allows to remove the saw damages leading to the formation of pyramids (5÷15 um) on both the surfaces of the wafer. The pyramids allows to reduce the reflectivity of the surface and to scatter and high angles the light in order to increase the optical path within the wafers.

A-Si:H layers are deposited on both sides of the c-Si wafers to passivate the c-Si surface by a reduction of silicon dangling bonds on the surface of the crystalline silicon wafers. The reduction of surface defects results in a reduction of the focalized defect levels inside the band-gap of the silicon wafers, which are recombination centers for minority carriers, causing a reduction of the open circuit voltage (Voc).

After passivation, contacts layers are deposited which consist of a p+ layer (p-a-Si:H), used to create the PN junction on one side, and a n+ layer (n-a-Si:H) deposited on the other side. When n-type c-Si (crystalline Silicon) are used, p-side of the cell is the emitter and in the scheme proposed it stands on the backside of the cell with respect to direct sunlight. To reach high efficiencies usually n-type silicon wafers are used and in this case the minority carriers are holes. The cell device is then completed by depositing a TCO layer on the two side of the wafer—typically ITO (Indium Tin Oxide)—that is a conductive oxide which acts as metallic contact to collect and to drive charges through the silver metallic grid. Then, grids of silver electrodes are screen printed on both sides, with different layout between front side and rear side.

The document US2018/0226529, upon the disclosure of which the preamble of claim 1 is drafted, illustrates a multi-junction photoelectric conversion device having an intermediate layer, sandwiched between a perovskite photoelectric conversion unit and a crystalline silicon-based photoelectric conversion unit, having a thickness ranging from 40 nm and 80 nm and a precisely determined refractive index in order to let light pass through the first conversion unit to reach the second photoelectric conversion unit without being reflected.

SUMMARY

In an effort to enhance further the performances of multijunction photovoltaic cells, such as for example tandem solar cells comprising a top sub-cell and a crystalline silicon based bottom sub-cell, the applicant noticed that efficiency of conversion of solar energy into electrical energy is limited mainly by the junction between a top sub-cell and a bottom sub-cell of the multijunction photovoltaic cell. This limitation is particularly felt in tandem photovoltaic cells comprising a perovskite based top sub-cell and a crystalline silicon based bottom sub-cell.

The above illustrated drawbacks are at least partially overcome in a multijunction photovoltaic cell as defined herein, which may be fabricated with the process defined also herein.

Preferred embodiments of the invention are defined in the dependent claims.

BRIEF DESCRIPTION OF THE DRAWINGS

FIGS. 3a to 3d depict exemplary embodiments of multijunction photovoltaic cells according to this disclosure.

DESCRIPTION OF EXEMPLARY EMBODIMENTS

In general, multijunction photovoltaic cells comprise a stack of superposed layers sandwiched between a bottom electrode of the multijunction photovoltaic cell and a top electrode of the multijunction photovoltaic cell, wherein the stack of superposed layers define at least one top sub-cell and one bottom sub-cell.

In the ensuing description reference is made for sake of simplicity to tandem photovoltaic cells having only a top sub-cell and a bottom sub-cell stacked together, such as the photovoltaic cells depicted in FIGS. from 2 to 3d, though what will be stated holds true and can be applied, mutatis mutandis, also to generic multijunction photovoltaic cells comprising at least one top sub-cell superposed to one bottom sub-cell.

A multijunction photovoltaic cell according to the present disclosure has:
 a bottom electrode 1;
 a bottom sub-cell 3 defined on the bottom electrode 1, wherein the bottom sub-cell 3 is a crystalline silicon based photovoltaic cell having a doped upper contact layer (not shown) either of P type or of N type;
 a top sub-cell 4 defined above the bottom sub-cell 3, having higher band gap than the bottom sub-cell 3 and having a doped lower contact layer (not shown) either of N type or of P type;
 a top electrode 2 defined on the top sub-cell 4.

Figure 1:
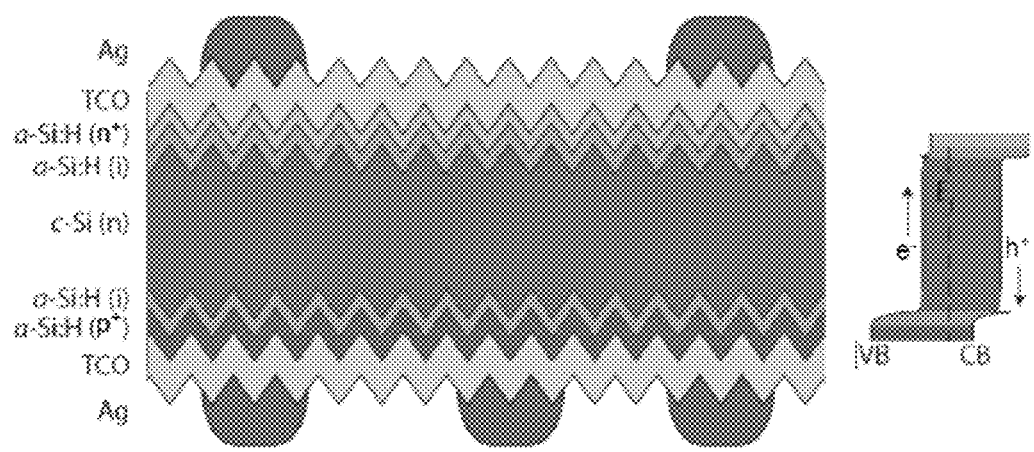
FIG. 1 depicts a multilayer structure of an HJT photovoltaic cell in a configuration back-emitter.
Figure 2:
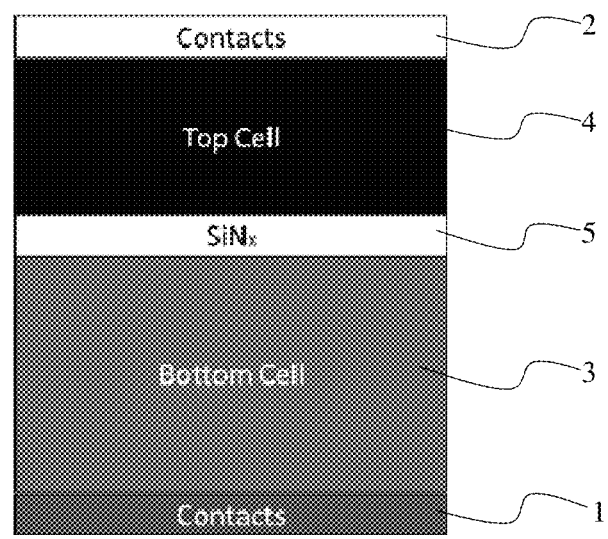
FIG. 2 depicts schematically an architecture of a multijunction photovoltaic cell according to this disclosure, comprising a SiN layer between a top sub-cell and a bottom sub-cell.

An example of a multijunction photovoltaic cell of this disclosure is depicted in FIG. 2, which shows a tandem photovoltaic cell having a crystalline silicon based photovoltaic bottom sub-cell 3 and a generic top sub-cell 4 made of any material having higher band gap than the crystalline silicon bottom sub-cell 3 and comprising an intermediate layer 5 of SiN interposed between the top sub-cell 4 and the bottom sub-cell 3.

Without being bound to a theory, it is believed that performances of the present multijunction photovoltaic cells having a top sub-cell 4 and a crystalline silicon based photovoltaic cell as a bottom sub-cell 3 stacked together are limited because the top sub-cell 4 and the bottom sub-cell 3 compose a P-N junction, in correspondence of the doped lower contact layer of the top sub-cell 4 and the doped upper contact layer of the bottom sub-cell 3, that reduces the flow of carriers from the top sub-cell 4 to the bottom electrode 1 of the multijunction photovoltaic cell. The n and p layers at the interfaces act as a p-n junction that during photovoltaic cell operation is reverse biased, thus reducing the conduction between the two sub cells. Therefore, the carriers generated by solar light impinging on the top sub-cell 4 must overcome the barrier constituted by this P-N junction in order to be collected by the bottom electrode 1.

This problem is not overcome by the device disclosed in US2018/0226529, which has an intermediate layer, sandwiched between a perovskite photoelectric conversion unit and a crystalline silicon-based photoelectric conversion unit, with a thickness determined to match the optical impedances of the light path and reducing as much as possible light reflection. In fact, considering that light captured by the photoelectric conversion unit has a wavelength of about 600 nm, the thickness of the intermediate layer of that prio device must be mandatorily greater than 40 nm in order to realize a quarter-wave optical impedance matching. Such a large thickness constitutes a relevant barrier for electrical carriers that relevantly reduces the conversion efficiency of the whole device.

In order to overcome this unexpected drawback, according to this disclosure an intermediate layer 5 of silicon nitride is realized with an appropriate thickness between the doped lower contact layer of the top sub-cell 4 and the doped upper contact layer of the bottom sub-cell 3. Even if silicon nitride is a dielectric, the applicant has found that by realizing such an intermediate layer of silicon nitride with a thickness between 1 nm and 10 nm, more preferably between 3 nm and 7 nm, measured as a separation distance between said doped upper contact layer and said doped lower contact layer, surprisingly enhances transport efficiency of carriers from the doped lower contact layer of the top sub-cell 4 to the doped upper contact layer of the bottom sub-cell 3. According to an aspect, the intermediate layer 5 of silicon nitride is sandwiched between the doped upper contact layer of the bottom sub-cell 3 and the doped lower contact layer of the top sub-cell 4 to form intermediate energy levels for carriers in the band-gap so as the doped upper contact layer, the intermediate layer 5 of silicon nitride and the doped lower contact layer are configured to define together a P-N tunnel junction for electric carriers. Considering the typical doping values of the doped upper contact layer and of doped lower contact layer, the tunnel effect cannot be attained if the thickness of the intermediate layer 3 is greater than 10 nm. Therefore, against the teaching disclosed in the prior document US2018/0226529, the intermediate layer 3 must not be dimensioned to provide optical impedance matching of the path of light, but should rather be very thin to form a P-N tunnel junction for electric carriers with the doped upper contact layer and the doped lower contact layer. A suitable process for realizing such a thin intermediate layer 3 providing intermediate energy levels for electric carriers in a band-gap defined by the doped upper contact layer and the doped lower contact layer, is disclosed hereinafter.

Figures 3A, 3B:
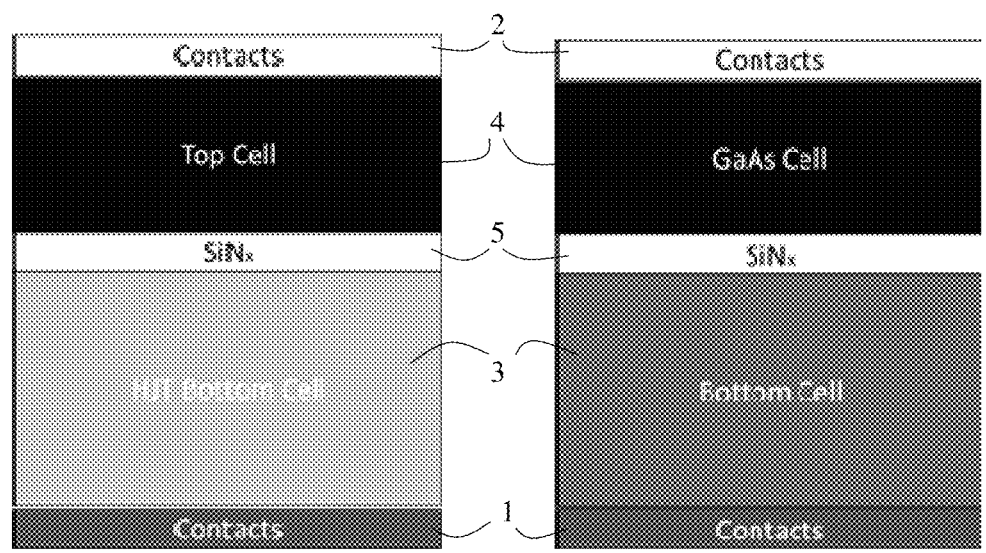

FIGS. 3a-3d depict exemplary structures of a tandem photovoltaic cell according to aspects of this invention, wherein:
 FIG. 3a represents a multijunction photovoltaic cell having a HJT bottom sub-cell 3 comprising a crystalline silicon based photovoltaic cell and a generic top sub-cell 4 made of any material having higher band gap than the crystalline silicon bottom sub-cell 3, and comprising an intermediate layer 5 of SiN interposed between the top sub-cell 4 and the bottom HJT cell 3;
 FIG. 3b represents a tandem photovoltaic cell having a crystalline silicon based photovoltaic bottom sub-cell 3 and a perovskite based photovoltaic top sub-cell 4 made of any material having higher band gap than the crystalline silicon bottom sub-cell 3, and comprising an intermediate layer 5 of SiN interposed between the top sub-cell 4 and bottom sub-cell 3;
 FIG. 3c represents a tandem photovoltaic cell having a crystalline silicon based photovoltaic bottom sub-cell 3 and a GaAs based photovoltaic top sub-cell 4 made of any material having higher band gap than the crystalline silicon bottom sub-cell 3, and comprising an intermediate layer 5 of SiN interposed between the top sub-cell 4 and bottom sub-cell 3;

FIG. 3*d* represents a tandem photovoltaic cell having a HJT bottom sub-cell 3 comprising a crystalline silicon based photovoltaic bottom cell and a perovskite based photovoltaic top sub-cell 4 made of any material having higher band gap than the crystalline silicon bottom sub-cell 3, and comprising an intermediate layer 5 of SiN interposed between the top sub-cell 3 and the bottom sub-cell 4.

Figure 4:
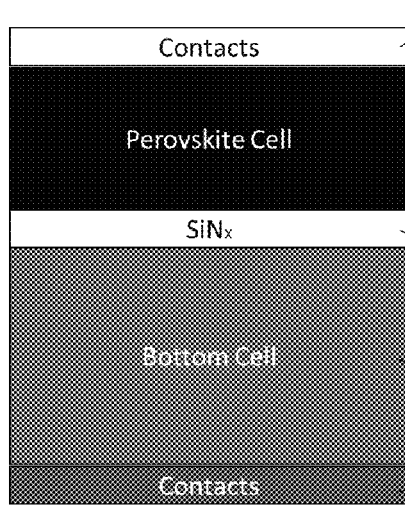
FIG. 4 illustrates energy bands at a N-P junction between a top sub-cell and a bottom sub-cell of the architecture of the multijunction photovoltaic cell of FIG. 2, in which a N2/H2 process has been carried out for realizing the SiN layer.
Figure 4:
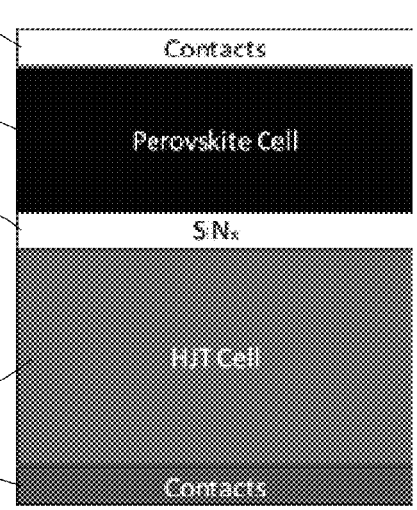
Figure 4:
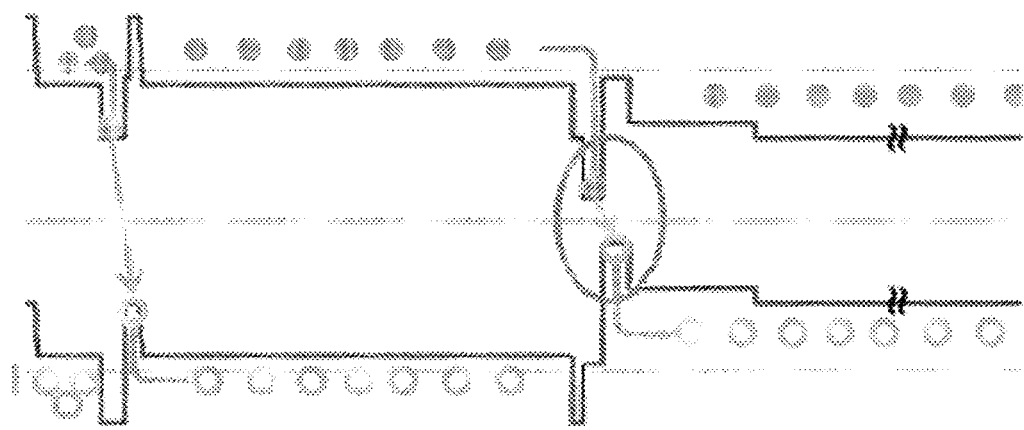

It is believed that the effect of the deposition of the intermediate layer 5 of silicon nitride is to optimize the band gap alignment between n and p layers of two sub-cells 3 and 4, connected to form a multiple-junction photovoltaic cell, forming traps at the p-n interface that induce energy levels in the energy gap that favour the tunnelling of carriers. FIG. 4 is a diagram that compares energy bands in correspondence of a P-N junction without an intermediate layer 5 of silicon nitride (at the left side), and in correspondence of a P-N junction with an intermediate layer 5 of silicon nitride (at the right side). The arrows at the right side indicate the allowable energy bands are introduced by the presence of the intermediate layer 5 of silicon nitride, that improves the overall conduction of the photovoltaic cell.

Tests carried out by the applicant have shown that outstanding results may be obtained by depositing the intermediate layer 5 of silicon nitride by a plasma assisted treatment. According to one aspect, the intermediate silicon nitride layer is deposited in a conformal manner by means of a Plasma Enhanced Chemical Vapour Deposition using a mix of H2 and N2. Nitrogen rich plasma treatment could lead to:
  (i) formation of SiN bonds, that could improve the conduction by trap assisted tunneling due to the formation of trap levels in the bang gap, or
  (ii) formation of higher energy gap silicon nitride layer at the interface with a consequent improved band alignment, open circuit voltage (Voc) and neutralization of parasitic effects.

According to an aspect, not shown in the enclosed figures, the multijunction photovoltaic cells of FIGS. 3*c* and 3*d* may be realized so as the bottom sub-cell 3 comprises:
  a first intrinsic layer of crystalline silicon deposited on the bottom electrode 1 of the multijunction photovoltaic cell,
  a doped upper contact layer made of amorphous silicon either of P or of N doping type, deposited on the first intrinsic layer of crystalline silicon;
and the top sub-cell 4 comprises:
  a doped lower contact layer made of amorphous silicon either of N or of P doping type,
  a layer of perovskite deposited on the doped upper contact layer and underneath the top electrode 2 of the multijunction photovoltaic cell.

According to an aspect, not shown in the enclosed figures, the multijunction photovoltaic cells of this disclosure may optionally comprise a top layer of transparent conductive oxide deposited on the top sub-cell 4 and below the top electrode 2 of the multijunction photovoltaic cell, and a bottom layer of transparent conductive oxide deposited below the bottom sub-cell 3 and above the bottom electrode 1 of the multijunction photovoltaic cell.

The multijunction photovoltaic cells of this disclosure may be realized with a related fabrication process comprising the steps of:
  defining the bottom sub-cell 3 on the bottom electrode 1, wherein the bottom sub-cell 3 is a crystalline silicon based photovoltaic cell having a doped upper contact layer either of P type or of N type,
  depositing the intermediate layer 5 of silicon nitride in a conformal manner on the doped upper contact layer of the bottom sub-cell 3,
  defining the top sub-cell 4 above the bottom sub-cell 3, wherein the top sub-cell 4 has higher band gap than the bottom sub-cell 3 and has a doped lower contact layer either of N type or of P type, wherein the doped lower contact layer either of N type or of P type of the top sub-cell 4 is defined on the intermediate layer 5 so as the intermediate layer 5:
    is sandwiched between and separates the doped upper contact layer and the doped lower contact layer, and forms intermediate energy levels for carriers in a band-gap defined by the doped upper contact layer and the doped lower contact layer,
    has a thickness comprised between 1 and 10 nm measured as a separation distance between said doped upper contact layer and said doped lower contact layer;
    the doped upper contact layer, the intermediate layer 5 of silicon nitride and the doped lower contact layer are configured so as to define together a P-N tunnel junction;
  defining the top electrode 2 of the multijunction photovoltaic cell on the top sub-cell 4.

According to one aspect, the intermediate layer 5 of silicon nitride may be obtained with a treatment realized with a Plasma Enhanced Chemical Vapour Deposition (PECVD) reactor, after deposition of a doped amorphous silicon layer, using a mix of H2 and N2 gases, wherein N2 percentage on H2 could vary from 2 to 20%. In order to achieve stable plasma conditions, process pressure is set in the range of 1-10 mbar and RF power density is set in the range of 0.01 to 0.5 W/cm2.

Measurements on sample treated with $N_2/H_2$ plasma reveal a significant presence of Si—N bond peak at a binding energy of 101.7 eV. Tests have been carried out to verify the effect of the presence of the intermediate layer 5 of silicon nitride comparing the results on performances of tandem cells, comprising a perovskite based top sub-cell 4 and a crystalline silicon based bottom sub-cell 3, with and without the intermediate layer 5. Results are summarized in the following table 1. The treatment reduced the cell series resistance (Rs) of 3.6% enhancing the FF (Fill Factor) of the cell of about 0.3%

TABLE 1

|  | Rs (ohm) | FF (%) |
| --- | --- | --- |
| With treatment | 5.30 | 73.5 |
| Without treatment | 5.50 | 73.3 |
| Delta % | −3.6% | 0.27% |

REFERENCES

[1] DeWolf, S., Descoeudres, A., Holman, Z., & Ballif, C. (2012). High-efficiency silicon heterojunction solar cells: A review. Green, 2(1), 7-24.

The invention claimed is:
1. A process for fabricating a multijunction photovoltaic cell comprising a stack of superposed layers sandwiched between a bottom electrode of the multijunction photovol- taic cell and a top electrode of the multijunction photovoltaic cell, the method comprising the steps of:
- defining a bottom sub-cell on said bottom electrode, wherein said bottom sub-cell is a crystalline silicon based photovoltaic cell having a doped upper contact layer either of P type or of N type,
- defining a top sub-cell above said bottom sub-cell, wherein said top sub-cell has higher band gap than said bottom sub-cell and has a doped lower contact layer either of N type or of P type,
- defining said top electrode of the multijunction photovoltaic cell on said top sub-cell,
- forming an intermediate layer of silicon nitride sandwiched between and separating said doped upper contact layer and said doped lower contact layer;

wherein the method comprises:
- forming said intermediate layer of silicon nitride by means of a Plasma Enhanced Chemical Vapour Deposition treatment, after deposition of a doped amorphous silicon layer, using a mix of H2 and N2 gases with a N2 percentage on H2 set at a percentage of between 2% to 20%, at a pressure of from 1 to 10 mbar and with a RF power density of from 0.01 to 0.5 W/cm$^2$, so as the intermediate layer:
- provides intermediate energy levels for electric carriers in a band-gap defined by said doped upper contact layer and said doped lower contact layer,
- has a thickness of between 1 and 10 nm measured as a separation distance between said doped upper contact layer and said doped lower contact layer; and
- said doped upper contact layer, said intermediate layer of silicon nitride and said doped lower contact layer being configured to define together a P-N tunnel junction for said electric carriers.

2. The process of claim 1, further comprising:
- depositing a top layer of transparent conductive oxide on said top sub-cell and below said top electrode of the multi-junction photovoltaic cell; and
- depositing a bottom layer of transparent conductive oxide below said bottom sub-cell and above said bottom electrode of the multi-junction photovoltaic cell.

* * * * *